United States Patent
Subramanian et al.

(10) Patent No.: US 7,339,244 B2
(45) Date of Patent: Mar. 4, 2008

(54) SMALL SCALE WIRES WITH MICROELECTROMECHANICAL DEVICES

(75) Inventors: Kanakasabapathi Subramanian, Albany, NY (US); Noel C. MacDonald, Santa Barbara, CA (US)

(73) Assignee: Cornell Research Foundation, Inc., Ithaca, NY (US)

( * ) Notice: Subject to any disclaimer, the term of this patent is extended or adjusted under 35 U.S.C. 154(b) by 50 days.

(21) Appl. No.: 11/340,135

(22) Filed: Jan. 26, 2006

(65) Prior Publication Data

US 2006/0249841 A1    Nov. 9, 2006

Related U.S. Application Data

(62) Division of application No. 10/606,812, filed on Jun. 26, 2003, now Pat. No. 7,022,617.

(60) Provisional application No. 60/391,901, filed on Jun. 28, 2002.

(51) Int. Cl.
*H01L 27/14* (2006.01)
*H01L 29/82* (2006.01)

(52) U.S. Cl. .................. 257/414; 977/700; 977/762

(58) Field of Classification Search .............. 257/414; 977/700, 724, 762, 784
See application file for complete search history.

(56) References Cited

U.S. PATENT DOCUMENTS 6,130,142 A    10/2000    Westwater et al.

7,129,554 B2*    10/2006    Lieber et al. ................ 257/414

OTHER PUBLICATIONS

Ayon, A. A., et al., "Characterization of a time multiplexed inductively coupled plasma etcher", *Journal of the Electrochemical Society*, 146(1), (Jan. 1999),339-349.

Bourland, S., et al., "Silicon-on-insulator Processes for the Fabrication of Novel Nanostructures", *J. Vac. Sci. Technol. B*, 19, No. 5, (Sep. 2001),1995-1997.

Chen, Jun, et al., "Field emission from crystalline copper sulphide nanowire arrays", *Applied Physics Letters*, 80 (19), (May 2002),3620-3622.

Cui, Yi, et al., "Nanowire nanosensors for highly sensitive and selective detection of biological and chemical species", *Science*, 293 (5533), (Aug. 2001),1289-1292.

Doherty, L., et al., "Application of MEMS technologies to nanodevices", *Proceedings of the 2003 IEEE International Symposium on Circuits and Systems*, vol. 3, (2003),934-937.

(Continued)

*Primary Examiner*—W. David Coleman
(74) *Attorney, Agent, or Firm*—Schwegman, Lundberg & Woessner, P.A.

(57) ABSTRACT

A process cycles between etching and passivating chemistries to create rough sidewalls that are converted into small structures. In one embodiment, a mask is used to define lines in a single crystal silicon wafer. The process creates ripples on sidewalls of the lines corresponding to the cycles. The lines are oxidized in one embodiment to form a silicon wire corresponding to each ripple. The oxide is removed in a further embodiment to form structures ranging from micro sharp tips to photonic arrays of wires. Fluidic channels are formed by oxidizing adjacent rippled sidewalls. The same mask is also used to form other structures for MEMS devices.

16 Claims, 11 Drawing Sheets

OTHER PUBLICATIONS

Huber, T. E., et al., "Thermopower of Bi nanowire array composites", *Thermoelectric Materials 2000. Materials for Small-Scale Refrigeration and Power Generation Applications*, 626, Materials Research Society Symposium Proceedings, San Francisco, CA,(Apr. 2000),Z14.2.1-Z14.2.5.

Ju, X. , et al., "Preparation and photoluminescence of nanowire array and films of cadmium sulfide by electrodepositing in organic solvent", *Proceedings of the SPIE*, 4601, (2001),260-265.

Li, Jian-Long , "Spontaneous formation of ordered indium nanowire array on Si(001)", *Applied Physics Letters*, 79(17), (Oct. 2001),2826-2828.

Liu, H. I., et al., "Self-limiting oxidation for fabricating sub-5nm silicon nanowires", *Applied Physics Letters*, 64(11), (Mar. 14, 1994),1383-1385.

Lizhu, Zhang , et al., "Photoluminescence of a silicon quantum wire array fabricated by electrolytic etching", *Chinese Physics*, 12(3), (Jul.-Sep. 1992),768-772.

Milanovic, V. , et al., "Micromachining Technology for Lateral Field Emission Devices", *IEEE Transactions on Electron Devices*, 48(1), (Jan. 2001),166-173.

Milanovic, V. , et al., "Micromachining Technology for Lateral Filed Emission Devices", *IEEE Transactions on Electron Devices*, vol. 48(1), (Jan. 2001),166-173.

Nakayama, T. , et al., "Thermally stable C60 nanowires on Si substrates", *RIKEN Review*, No. 45, Inst. Phys. Chem. Res.,(Mar. 2002),3-5.

Namatsu, H. , et al., "Fabrication of One-Dimensional Nanowire Structures Utilizing Crystallographic Orientation in silicon and their Conductance Characteristics", *J. Vac. Sci. Technol. B*, 15, No. 5, (Sep. 1997),1688-1696.

Ono, T. , et al., "Micromachined probe for high density data storage", *Technical Digest. CLEO/Pacific Rim 2001. 4th Pacific Rim Conference on Lasers and Electro-Optics*, pt. 2, p II, Chiba, Japan Piscataway, NJ: IEEE, 2001,(Jul. 15-19, 2001),542-543.

Potts, A. , et al., "Fabrication of free-standing single-crystal silicon nanostructures for the study of thermal transport and defect scattering in low dimensional systems", *Japanese Journal of Applied Physics, Part 1 (Regular Papers & Short Notes)*, 29(11), (Nov. 1990),2675-2679.

Roy, E. , "Electrochemical synthesis of antimony nanowires and analysis of diffusion layers", *Journal of Nanoscience and Nanotechnology*, 1 (3), (Sep. 2001),323-329.

Wang, Z. , et al., "AFM study of gold nanowire array electrodeposited within anodic aluminum oxide template", *Applied Physics A (Materials Science Processing)*, A74 (4), Springer-Verlag,(Apr. 2002),563-565.

Wang, Y. W., et al., "Fabrication and magnetic properties of highly ordered Co16Ag84 alloy nanowire array", *Applied Physics A (Materials Science Processing)*, A74 (4), Springer-Verlag,(Apr. 2002),577-580.

Wang, Y. Q., et al., "One-dimensional growth mechanism of amorphous boron nanowires", *Chemical Physics Letters*, 359 (3-4), (Jun. 2002),273-277.

Wang, J. Z., et al., "Ordered Ga wires formed on Si(100)-2*n: Scanning tunneling microscopy study", *Physical Review B, Condensed Matter and Materials Physics*, 65 (23), (Jun. 2002),235303/1-5.

Westwater, J. , et al., "Growth of silicon nanowires via gold/silane vapor-liquid-solid reaction", *Journal of Vacuum Science and Technology*, 15(3), (May 1997),554-557.

Zaidi, S. H., et al., "Multiple nanowire gate field effect transistors", *Proceedings of the 2001 1st IEEE Conference on Nanotechnology. IEEE-NANO 2001*, IEEE-NANO, Maui, HI,(Oct. 2001),189-194.

Zhang, Y. F., et al., "Bulk-quantity Si nanowires synthesized by SiO sublimation", *Journal of Crystal Growth*, 212, (Apr. 2000),115-118.

Zhang, J. , et al., "Morphology and Raman scattering spectrum of GaN nanowires embedded in nanochannels of template", *Journal of Physics D, Applied Physics*, 35 (13), (Jul. 2002),1481-1485.

Zhu, Hao , "Fabrication and magnetic properties of Fe14Ni86 alloy nanowire array", *Journal of Physics: Condensed Matter*, 13 (8), (Feb. 2001),1727-1731.

* cited by examiner

SMALL SCALE WIRES WITH MICROELECTROMECHANICAL DEVICES

RELATED APPLICATIONS

This application is a divisional of U.S. patent application Ser. No. 10/606,812, filed Jun. 26, 2003 now U.S. Pat. No. 7,022,617, which claims the benefit of U.S. Provisional Application Ser. No. 60/391,901, filed Jun. 28, 2002, which applications are incorporated herein by reference.

GOVERNMENT FUNDING

The invention described herein was made with U.S. Government support under Grant Number DABT 63-95-C-0121 awarded by DARPA. The United States Government has certain rights in the invention.

FIELD OF THE INVENTION

The present invention relates to small scale wires, and in particular to small scale wires with microelectromechanical (MEMS) devices.

BACKGROUND OF THE INVENTION

Formation of single suspended wires or an array of suspended wires on a nanometer scale has been difficult to perform. Prior methods do not produce wires of desired size, and result in inconsistent wire spacing, low strength and low reliability wires. Previous processing methods to form these wires are lengthy and/or complicated. A notch on a vertical silicon beam has been previously used to fabricate a single wire by thermal oxidation.

SUMMARY OF THE INVENTION

A process cycles between etching and polymerizing chemistries to create rough sidewalls that are converted into small structures. In one embodiment, a mask is used to define lines in a single crystal silicon wafer. The process creates ripples on sidewalls of the lines corresponding to the cycles when the line is etched deep into the substrate silicon. The lines are oxidized in one embodiment to form a silicon wire corresponding to each ripple. The same mask is also used to create other microelectromechanical structures (MEMS).

In further embodiments, etching of the lines continues, resulting in a suspended wire. In still further embodiments, the rippled lines are spaced apart a desired amount such that oxidation of the lines creates fluid channels between the lines. In still further embodiments, three dimensional periodic arrays of wires are created from a single mask, with the wires supported by thicker columns.

Sieves are also created by controlling the spacing and amount of oxidation of the silicon wires. In further embodiments, a loading effect is utilized to create a sieve with decreasing wire spacing, for sorting materials by size.

Further applications of the process include three dimensional photonic bandgap structures, piezoresistive nanowire arrays responsive to extremely small forces and displacements, and nanowire arrays operating as low loss, high Q, high frequency filters. In still further embodiments, arrays of conical shaped sharp tips are created by continued oxidation of wire arrays.

DETAILED DESCRIPTION OF THE INVENTION

In the following description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized and that structural, logical and electrical changes may be made without departing from the scope of the present invention. The following description is, therefore, not to be taken in a limited sense, and the scope of the present invention is defined by the appended claims.

Figure 1:
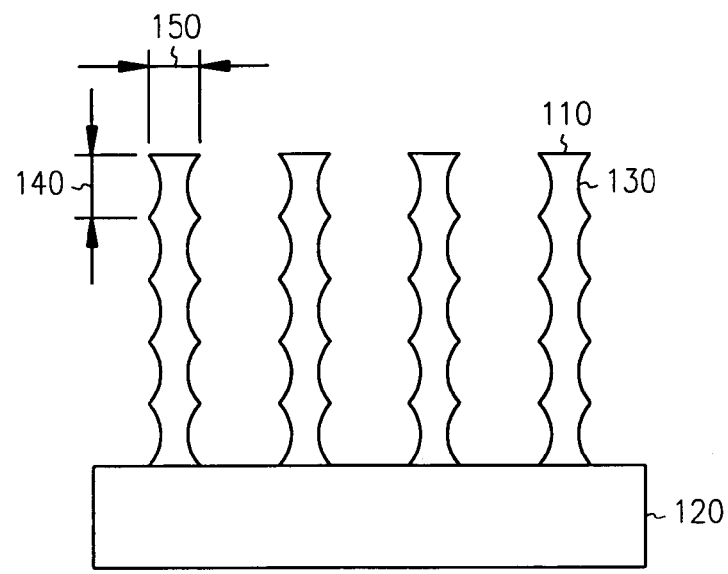
FIG. 1 is a cross section representation of rippled lines formed by a cyclic etch and passivation process.

FIG. 1 is a cross section representation of rippled lines 110 formed in a single crystal silicon substrate 120. Each line 110 comprises one or more ripples 130. The ripples are formed with an undercut 140 on the order of one-half the size of a line width indicated at 150. In one embodiment, the widths are approximately the same size. The ripples are formed using a process of alternating plasma etching and passivation or polymerization. One such process is referred to as a Bosch process.

The Bosch process utilizes an inductively coupled plasma etch process whereby etcher chemistry is switched or cycled every few seconds back and forth between etching and polymerizing chemistries. The Bosch process is commonly used to produce high rate anisotropic trench etching of silicon. During the etch chemistry step, rapid isotropic etching of the silicon occurs. During the polymerizing chemistry portion of the process all exposed surfaces of the substrate are coated with polymer. During the next etch chemistry portion of the process, ion bombardment and chemical reaction removes the polymer from both the bottom and the sides, and an isotropically etched cavity in silicon is then created.

In one embodiment, The Bosch process works by alternating deposition and etching steps in an Inductively Coupled Plasma (ICP). A passivating material is deposited on the wafer and this is followed by an etching step that etches passivation more aggressively on the floor than on the sides. Once the floor is exposed, the silicon is undercut with an isotropic etch using fluorine chemistry. Rapidly alternating cycles of deposition and etching result in a series of undercuts in silicon, resulting in a profile that is vertical on average. This series of undercuts appear as scallops or ripples on the sidewall. Profile control during etching is achieved by a technique called morphing. Deposition and etch parameters are varied from one cycle to another thus resulting in an etch profile that is different for each cycle. Morphing is used to create cross-sections that are shaped differently from the standard etch profile.

Typical deposition steps are done at 25 mTorr with 14 sccm C4F8 and 850 watt ICP power for 5 seconds. Typical etch parameters are 25 mTorr Pressure, 200 sccm SF6 with 8 watt RIE power and 850 watt ICP power for 7 seconds. Both deposition and etching steps use backside Helium cooling. Depending on the RIE tool, Argon is optionally used in the plasma.

Much of the prior focus on the Bosch process is directed toward reducing microscopic "scallops" that form on the trench sidewalls being etched. There are several ways to control scalloping. In this embodiment, the degree of sidewall scalloping may be controlled by varying the relative length of the etching and deposition cycles. In the current embodiment, the cycle is stretched to create larger ripples in each line 110. The etch is approximately 1.8 times the passivation in the current embodiment. A 9 second etch in one embodiment is followed by a 5 second passivation time to provide ripples of the desired size.

Recipe parameters are used to control both the etch rate and the profile of the etch. Larger etch rates are usually achieved by making the process more aggressive by increasing the time in the etch cycle. The deposition cycle time is also increased appropriately so as to maintain the profile shape. The flow rate of the etching gases can also be increased. Profile control is achieved by controlling mainly the RIE electrode power and the etch time relative to the polymer deposition time. Increasing the RIE power makes the etch more anisotropic. Increasing the etch time relative to the deposition time makes the profile more reentrant.

Rougher sidewalls can be achieved by a combination of several methods. The time in the etch portion of the cycle can be increased relative to the deposition time. This gives deeper undercuts and hence rougher sidewalls. Changing the etch time alone presents the risk of passivation failure on the sidewall before the etch step in the cycle is complete. If there is evidence of sidewall passivation failure, the etch step may be made slightly more directional by increasing the RF power at the risk of making the scallops taller in relation to their width. The deposition step in one embodiment uses zero RIE power and it is difficult to increase lateral deposition by modifying this step. Gas flow rates are found to have a weaker effect on the etch profile compared to cycle times and are hence left at their standard values. Argon flow rate is found to control the stability of the plasma and is increased to stabilize the rapidly alternating etch deposition cycles.

Beyond these modifications, the etch process may be morphed since the etch profile naturally starts to taper in narrow gaps. It is found that in standard etch recipes, line width slowly increases as etching proceeds deeper into the wafer. Morphing ensures that the deposition and etching parameters are increasingly aggressive so as to sustain the etch uniformly across large depths or, equivalently, to ensure that the roughness to line width ratio is maintained throughout the etch. Morphing parameters depend on the width of the gap being etched.

Figure 2:
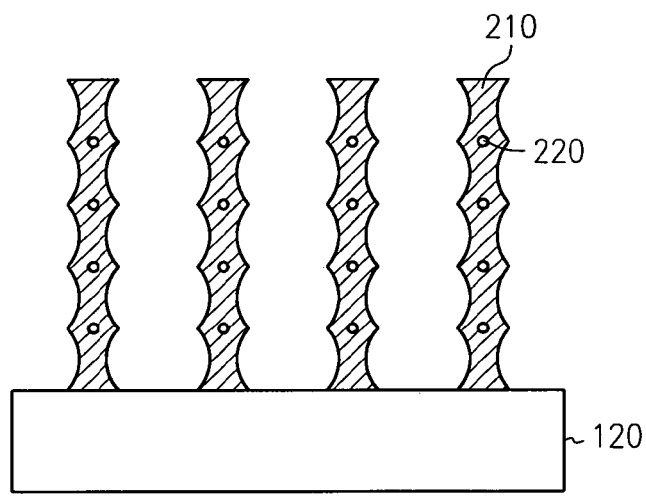
FIG. 2 is a cross section of the rippled lines of FIG. 1 after oxidation.

Following formation of the ripples in one embodiment, an oxidation of the lines is performed as shown in FIG. 2. The oxidation is a thermal oxidation in one embodiment, resulting in consumption of silicon, and leaving behind $SiO_2$, as indicated at 210. The length of time of the oxidation is controlled such that a silicon wire encased in the oxide remains for each ripple as indicated at 220. The length of time of the oxidation may be easily controlled to select different sizes of wires. In one embodiment, the wires are spaced approximately 400 nm from each other in a line.

Figure 3:
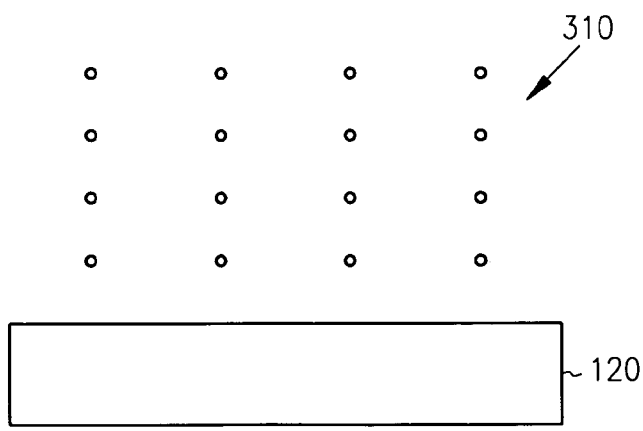
FIG. 3 is a cross section of wires formed after stripping away the oxide formed in FIG. 2.

In FIG. 3, a BHF strip is performed in a known manner to remove the oxide from the wires, leaving an array of wires indicated generally at 310. Support structures for the wires are generally formed of thicker lines that are not fully etched or consumed by oxide. Such structures are discussed with reference to further figures. The spacing of the wires is also dependent on the spacing of the lines. Several variations are within the scope of the invention. In one embodiment, the cycle times are varied to produce different size ripples. This variation may be used to control the size and frequency of the wires in a line. With a larger ripple (larger in height), few or no silicon wires may be formed, whereas smaller ripples form smaller wires and a higher density of wires. While the wires were spaced 400 nm in one embodiment, the process is variable to produce much larger and smaller wires as desired.

In one method, wire arrays in three dimensions are formed with only two process steps. A set of lines is exposed on a silicon substrate with photoresist. These lines could be either intersecting or non-intersecting as long as they are attached to a wide support. The exposed lines are etched using a Bosch process where the isotropic undercut during the etch step of the etch deposition cycle is larger than half the line width. In this case the etch time was set to 2.5 times the deposition time. As described earlier, the RF power is increased to ensure that the sidewall passivation is not consumed during the etch. The recipe is morphed so as to increase the RIE power by 1 Watt and the etch time by 2 second every 20 cycles. The result is a consistent array of wires with diamond shaped cross sections into the plane of the wafer. The exact recipe and the morphing parameters used are specific to the tool and the pattern layout on the mask. The most significant aspects to pattern layout are the amount of exposed silicon and the trench widths between the lines forming the wires. Smaller trenches need more aggressive etch recipes.

Figure 4:
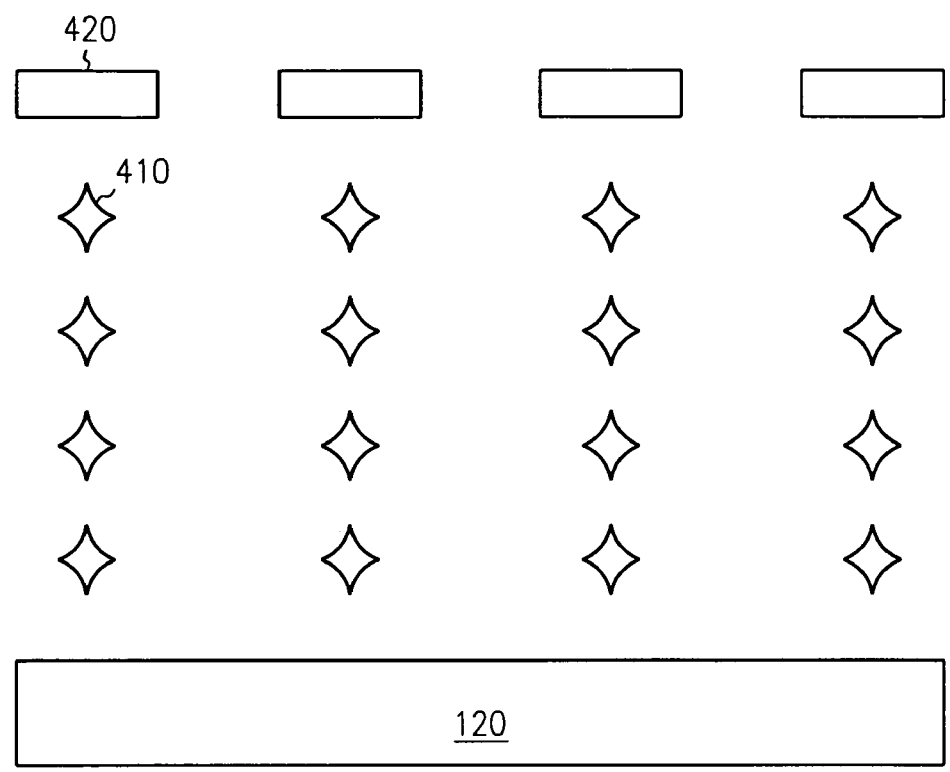
FIG. 4 is a cross section representation of more aggressive etching of the rippled lines of FIG. 1, forming an alternative set of wires.

FIG. 4 illustrates an alternative method of forming the wires from the rippled columns. In this embodiment, the ripples are made much larger (larger in width). In fact, the ripples are so large in this embodiment that each inherently forms a silicon wire 410 in each line 420, without the need for oxidation to consume connecting silicon. Further oxidation may be performed if desired to smooth the wires or to reduce their size, to increase Si-Si wire spacing or increase oxide-oxide wire spacing. Other materials may also be coated on these wires by standard methods.

Figure 5:
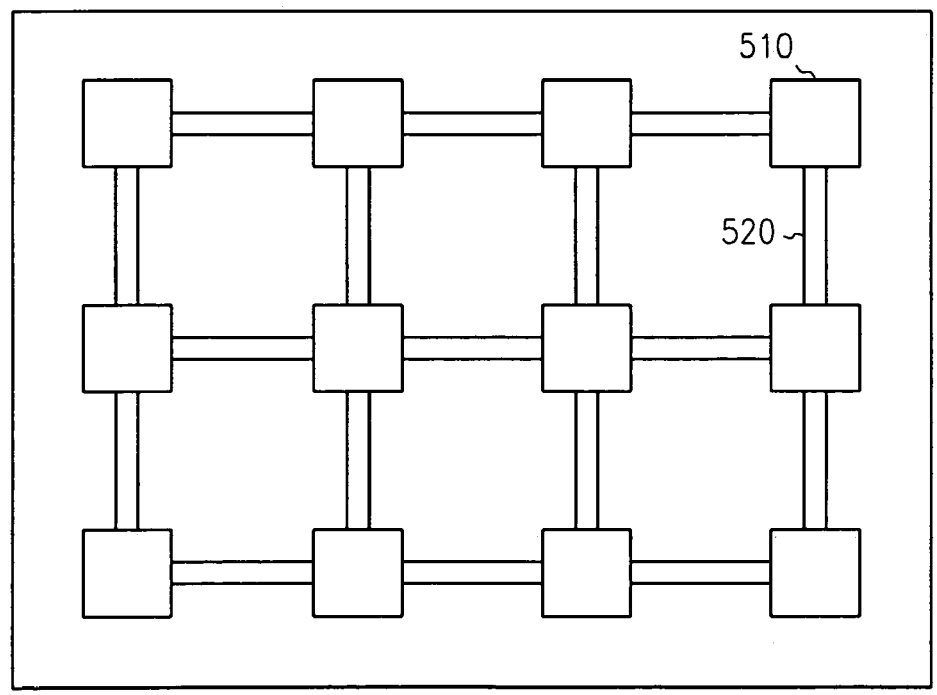
FIG. 5 is a plan view representation of a mask defined set of pillars and lines for formation of a three dimensional array of wires.

FIG. 5 illustrates a planar view of lines formed using a common masking process. In this embodiment, support structures are formed as indicated at 510. Each support structure is generally square in one embodiment, forming an array of support structures. Lines defining where wires are to be formed are shown connecting each side of each support structure 520. The lines defining the wires are generally, (but not necessarily) of less width than the support structures so that the support structures remain after further processing to form the wires from the lines. In one embodiment, a mask is used to create an array of intersecting lines of the same width. Since the lines are etched less where they intersect, support structures for the wires are automatically formed during formation of the wires.

Figure 6:
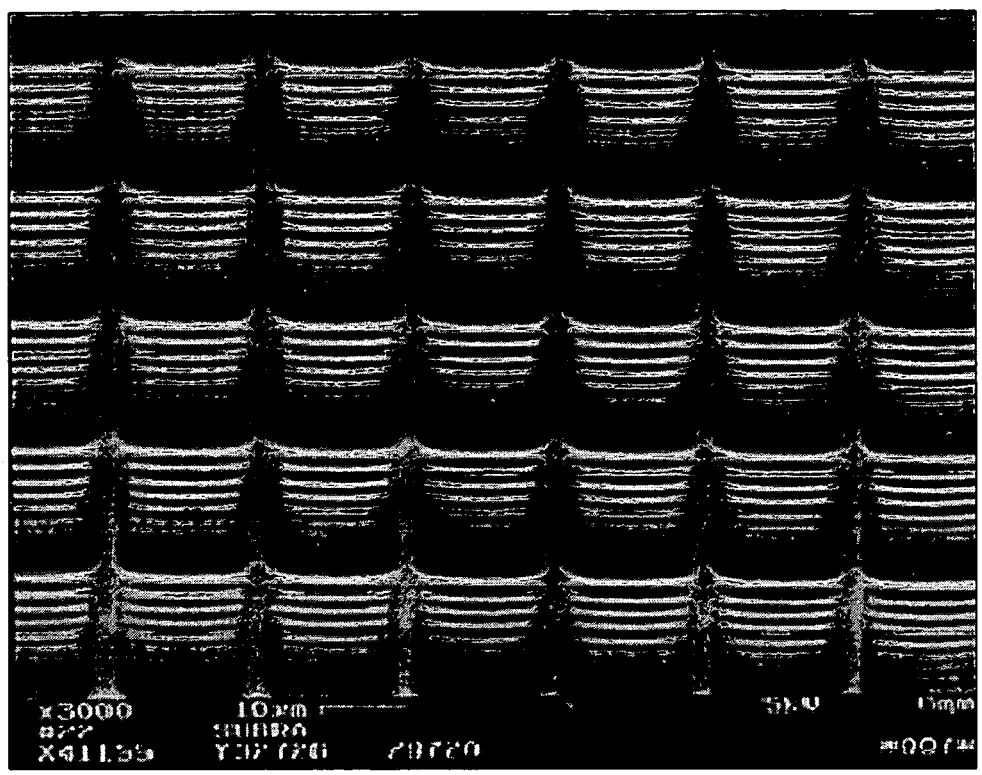
FIG. 6 is a photograph of a perspective view of a three dimensional array of wires formed in accordance with the present invention.
Figure 7:
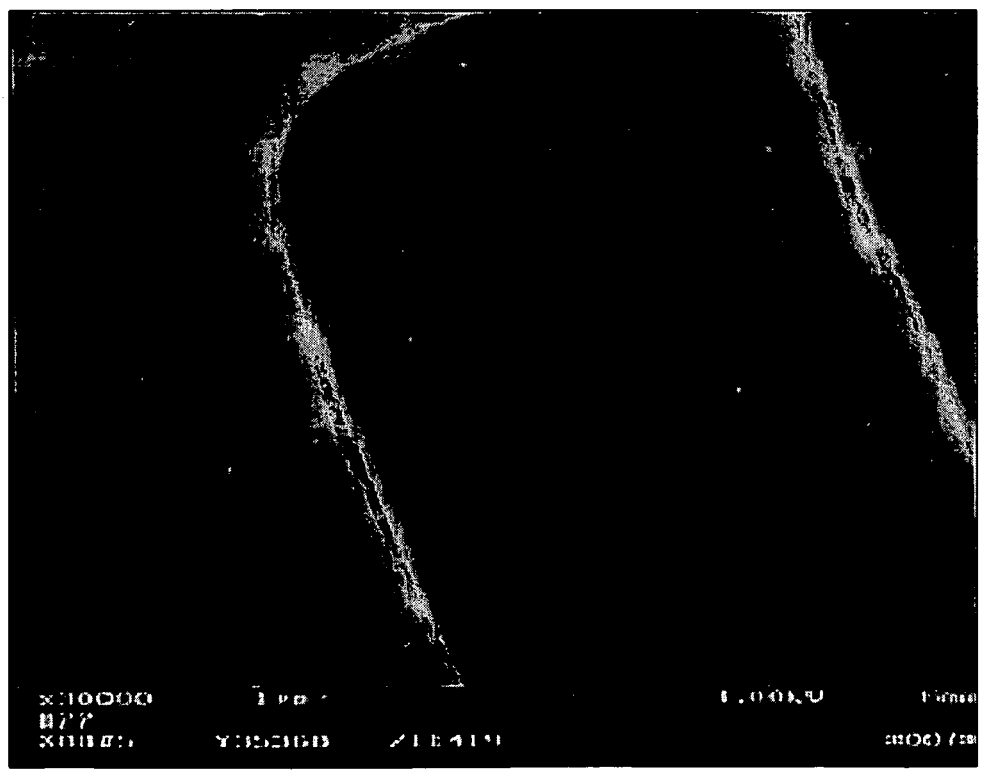
FIG. 7 is a electron micrograph of a perspective view of the array of FIG. 6 at the point at which the wires contact support structures.

FIG. 6 is a view of wires formed from the array of FIG. 5. Each wire may be approximately 5 um in length, and the spacing between wires in a line may be approximately 400 nm as shown in FIG. 7, which is a magnified view of a portion of the view in FIG. 6. Both the spacing between wires, and between lines, representing the length of the line, may be varied significantly. The wires are thicker closer to each support structure, as indicated at 710. At 710, the wire is shaped line a cone, with the thicker portion of the cone extending from support structure 720.

In one embodiment, the array or three dimensional lattice of wires comprises a photonic bandgap structure. Typical lattice spacing is 1 to 1.5 microns, approximately the wavelength of infrared (IR) light. Smaller and larger spacings are also obtainable using the process. In one embodiment, the ratio of wire diameter to spacing is 0.1 to 1 or even higher (between the edges of the wires). The three dimensional lattice traps a desired wavelength, passing through light of other wavelengths. One way to bend light is to have missing wires Missing wires can be obtained based on the use of thinner lines in the initial mask, by modifying the geometry of lines or intersections on the mask or by varying etch parameters to eliminate wires. Further, etch parameters can be varied during the etch.

In one embodiment, etching of the wires is continued until only the cone portion 710 remains where each wire is attached to a support structure. The cone 710 has a very sharp tip to it. To form multiple two dimensional arrays of sharp tips, a thick line is defined for each array, with thinner lines extending a desired distance from the thick lines. Ripples are then formed as above, either followed by oxidation until only sharp tips remain after removal of the oxidation, or by aggressively etching until only the sharp tips attached to the support structure exist. Again, one tip per ripple is usually formed.

Figure 8:
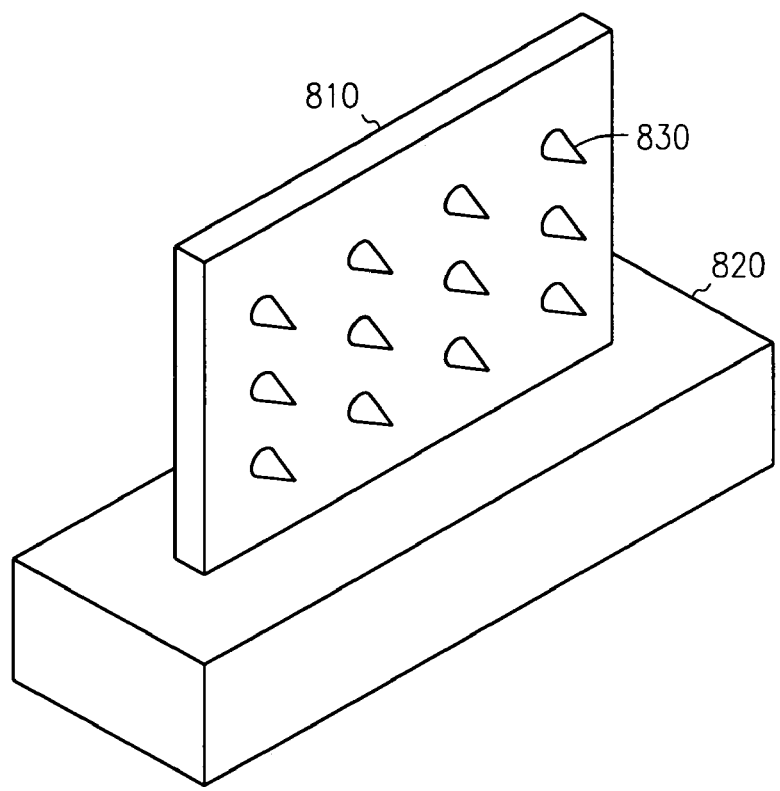
FIG. 8 is a perspective block representation of an array of sharp tips formed on a support structure.

A block representation of such an array of tips is shown in FIG. 8. A support structure comprising a column 810 is coupled to a substrate 820. The tips are formed in an array on column 810 as indicated by tip 830.

Figure 9:
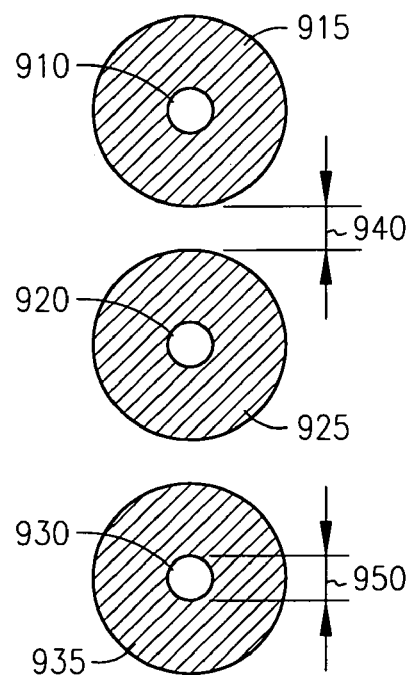
FIG. 9 is a cross section representation of a sieve formed of oxidized wires formed in accordance with the present invention.

FIG. 9 is a cross section of wires in a column used to form a sieve. In this embodiment, wires 910, 920 and 930 are formed as above from a single line on a single crystal silicon semiconductor substrate. Each of the lines is then oxidized as indicated at 915, 925 and 935 respectively to create a desired gap between each oxidized wire as indicated at 940. The wire diameter 950 is selected once a desired gap is selected. The diameter 950 is calculated knowing that oxidation of the initially formed silicon wire results in oxide growth of about 2.27 times the amount of silicon consumed. This makes it a simple matter to determine the initial desired wire size. Since oxide growth is very controllable, precision sieves are easily constructed.

Figure 10:
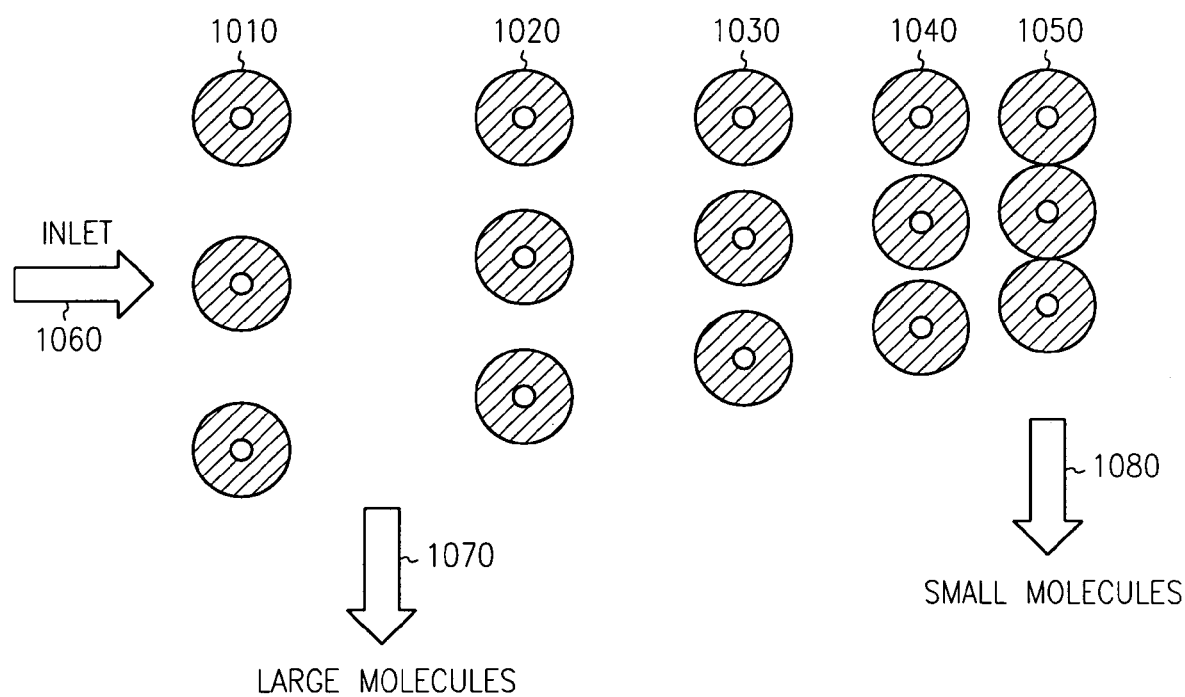
FIG. 10 is a cross section representation of a sieve formed of oxidized wires, wherein the spacing of the wires decreases in one direction.

FIG. 10 is a cross section of a sieve constructed as in FIG. 9, but showing multiple lines 1010, 1020, 1030, 1040 and 1050. The spacing between the lines is progressively smaller, resulting in a decreased etch depth due to a loading effect on the etcher utilized. This results in a closer spacing of the oxidized wires where the lines are closer together. Thus, a progressively more selective sieve is created, allowing smaller molecules to pass further through the sieve, while larger molecules exit the sieve sooner. An inlet is shown at 1060, and particles of varying size are represented as exiting at 1070 and 1080.

Figure 11:
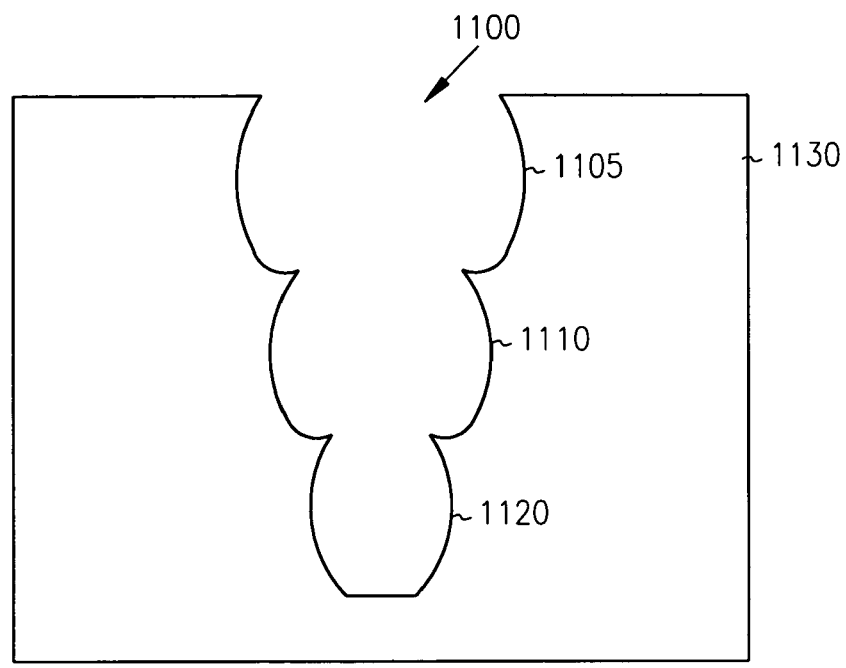
FIG. 11 is a cross section representation of a tapering high ripple trench formed by a cyclic etch and passivation process.
Figure 12:
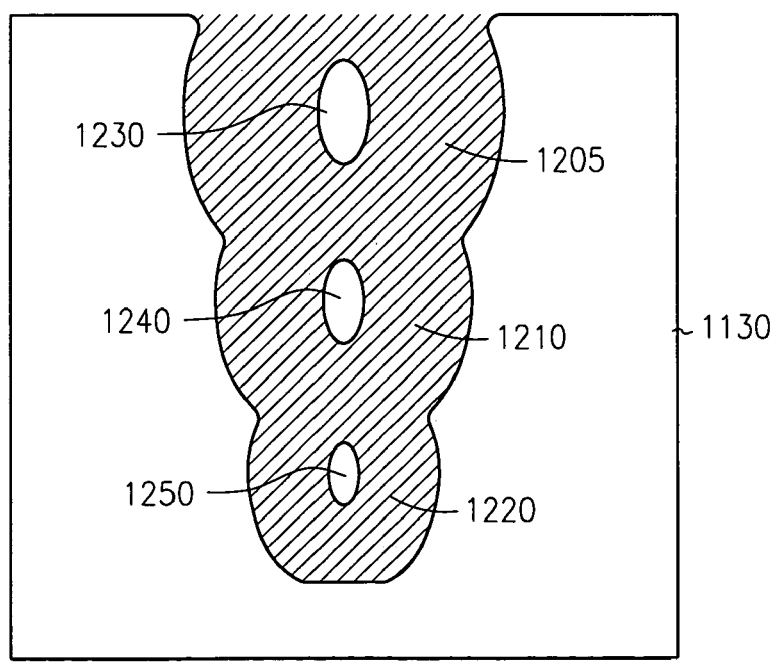
FIG. 12 is a cross section representation of fluid channels formed by oxidation of the high ripple trench of FIG. 11.

In a further embodiment, microfluidic channels are formed as illustrated by FIGS. 11 and 12. A high ripple trench 1100 is first formed using the cycle etching and passivation process described above. In one embodiment, the trench is tapered, decreasing in width with depth. In further embodiments, other shapes may be used, such as one having walls perpendicular to the substrate. The length of time for each cycle is decreased to obtain the taper. Progressively smaller ripples are shown at 1105, 1110 and 1120 formed in substrate 1130, which is single crystal silicon in one embodiment.

Following formation of the trench, an oxidation step is performed, such as thermal oxidation. Oxide corresponding to the ripples forms at 1205, 1210 and 1220 respectively, forming fluidic channels 1230, 1240 and 1250 respectively. The size of the channels is controlled by the size of the ripples and the amount of time the oxidation is performed.

In still a further embodiment, almost continuous wires are defined between support structures. The etch or oxidation continues from forming a normal continuous wire to create a break in the wire. Thus, two wires with opposed tips a desired distance apart are formed. The distance is controlled to ensure that tunneling current via quantum effect is modified by slight displacements of the support structures. Thus, the resulting separated wire structure serves as a displacement sensor.

In still further embodiments, one or more wires between support structures exhibit a piezoresistive effect with changing linear stress on the wires created by forces acting on the support structures.

Figure 13A:
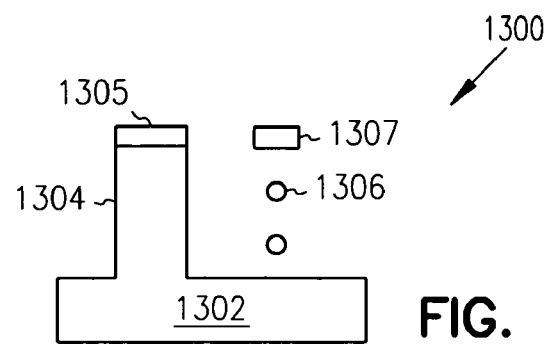
FIGS. 13A, 13B, 13C, 13D, 13E, 13F, 13G, and 13H illustrate a process of forming wires with MEMS structures.

FIG. 13A-13H show process steps used to create wires or channels and MEMS devices utilizing a single mask. The mask is used to define columns for both the formation of wires or channels as described above, and wider structures that are not consumed by the steps used to form the wires or channels. Such a structure is shown in FIG. 13A at 1300 formed on a substrate 1302. A thick line or beam 1304 formed under oxide 1305 is shown in combination with a set of wires 1306 formed as above from a thin line represented by oxide 1307. Oxide 1305 and 1307 are formed from the use of a single mask. The thick line 1304 has rough sidewalls from the process used to form the wires.

Figure 13B:
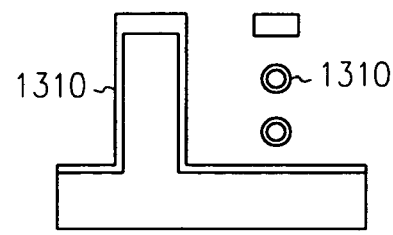
Figure 13C:
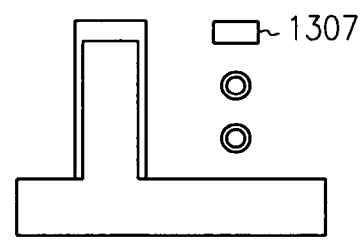
Figure 13D:
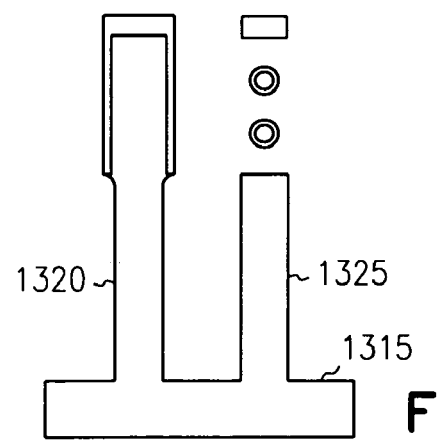

In FIG. 13B, the structures are thermally oxidized to smooth the beam 1304 and protect the wires as indicated by oxide layer 1310. An RIE oxide etch is then performed to clear the floor as indicated in FIG. 13C. The oxide 1310 remains on the beam and wires. Once the floor is cleared, a deep RIE, referred to as a shadow extension etch is performed to lower the floor to a level indicated at 1315. This results in the extension of the beam at 1320 and the formation of a thin beam 1325 corresponding to the oxide 1307 used to define the wires.

Figure 13E:
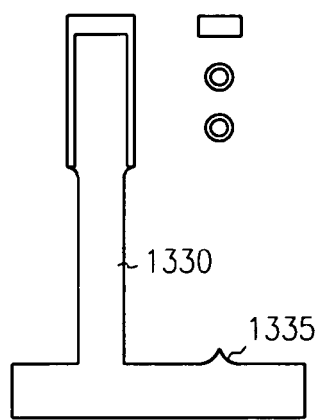
Figure 13F:
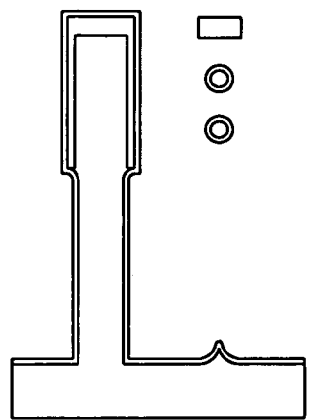
Figure 13G:
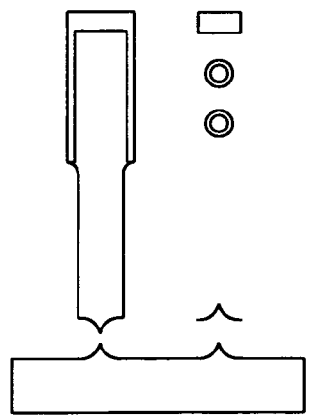
Figure 13H:
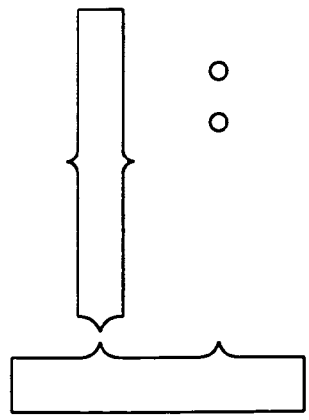

In FIG. 13E, the thin beam is released by a timed SF6 RIE, which also results in narrowing of the extension of the wider beam at 1330. Only a small protrusion 1335 remains of thin beam. The resulting structure is passivated, such as by PECVD Oxide, as indicated in FIG. 13F, resulting in a coating of oxide around all the structures. The structures are released as shown in FIG. 13G by a timed SF6 RIE, resulting in beam 1304 and its extension 1330 being detached from the substrate 1302. The oxide coating the structure may remain in place, or may removed such as by a BHF strip as indicate in FIG. 13H. Thus, a single mask is used to integrate wire or channel formation with formation of other MEMS devices using the SCREAM process. This is just one possible method to combine SCREAM MEMS and wires on the same mask. Other methods may also be utilized.

Figure 14:
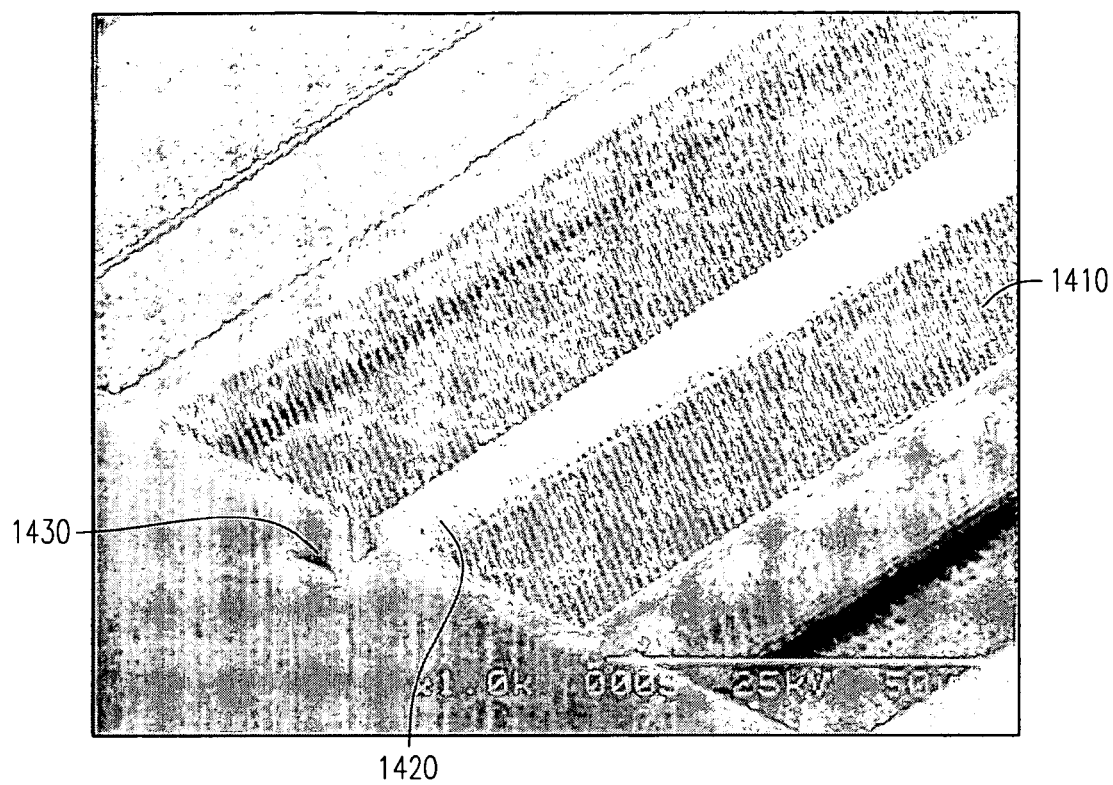
FIG. 14 is a perspective view of a wire array with integrated waveguide.
Figure 15:
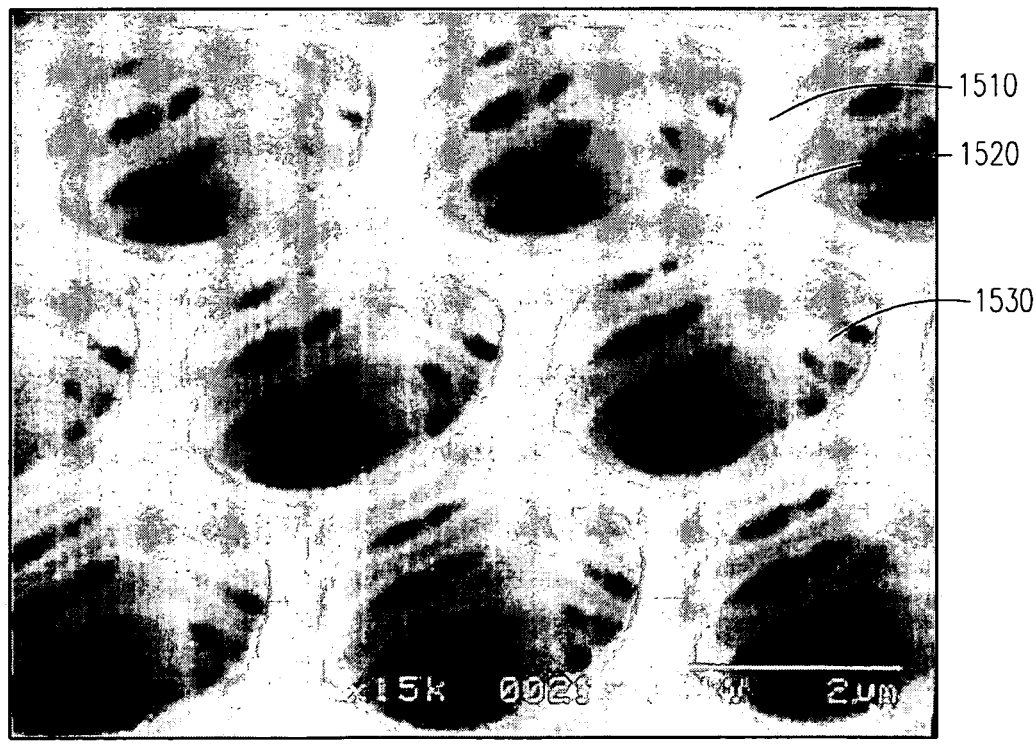
FIG. 15 is a perspective view of a hexagonal wire array.

FIGS. 14 and 15 show 3-D, diamond like lattices of wires 1410 with a silicon waveguide 1420 passing through each lattice. Notches 1430 on either end are machined using a focused ion beam tool to create a 45 degree mirror so as to transmit and receive light from the lattice. FIG. 15 shows closer view of one of these lattices. Wires 1510 become progressively wider as they reach supports 1520. This results in a series of conical shapes near the supporting structures, while the wires themselves are fairly straight. The wire and its two sloping supports form three faces of a hexagon 1530. There are multiple levels or layers of such hexagons shown.

By properly tuning the etch recipe and the gaps on the mask pattern, the shape is made to resemble the in-plane hexagon on the mask, thus making the lattice more truly hexagonal. The diamond lattice has hexagonal projections along certain planes but the lines forming these hexagons are not planar. Both cubic and hexagonal 3-D arrays using the same two step process sequence may be formed simply by changing 2-D information on the mask. Both arrays may be useful in photonics applications.

Figure 16:
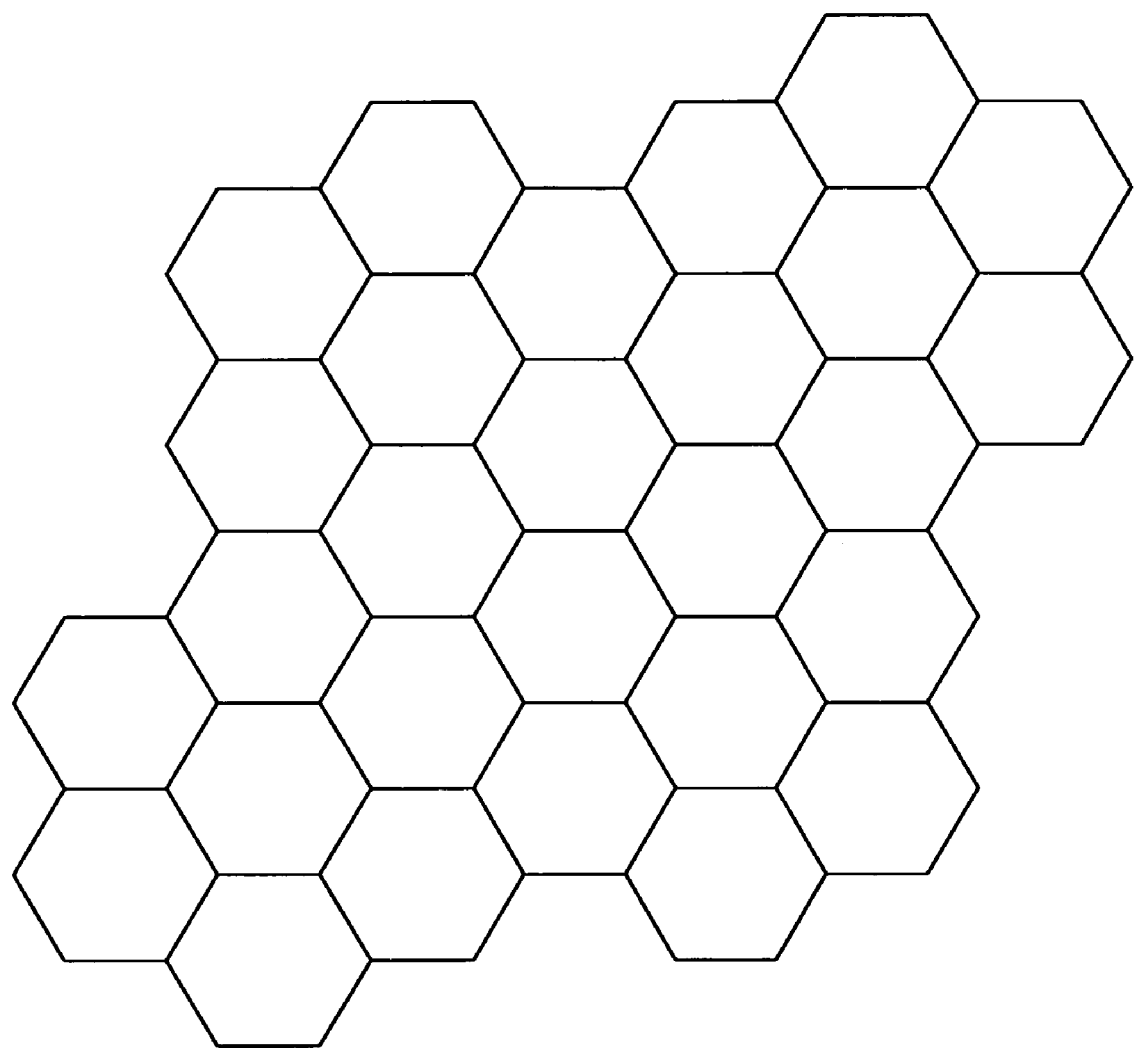
FIG. 16 is an example mask for forming a hexagonal wire array.

FIG. 16 is a partial view of a mask for forming a hexagonal wire array. In this example, the mask very much resembles the honeycomb structure of the resulting lattice.

Figure 17:
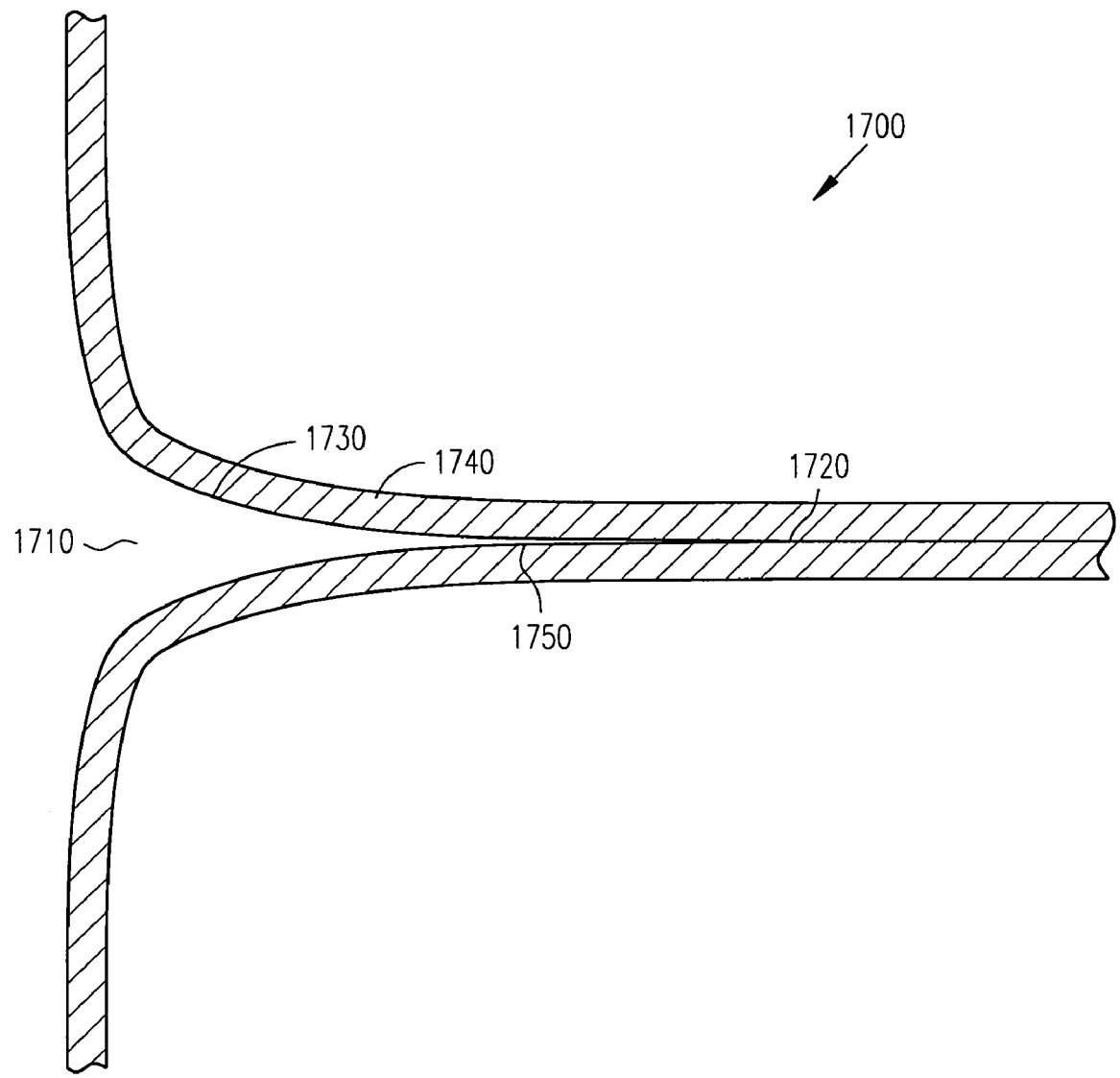
FIG. 17 is a cross sectional view of a tip.

FIG. 17 is a cross sectional view of a tip 1700 formed in a manner similar to the tips of FIG. 8. As mentioned above, the tips are formed by "T" or "Plus" intersections on a mask pattern as indicated at a support 1710. The intersections are etched much less than the wires themselves. Wire 1720 becomes progressively wider at 1730 as it gets close to its support 1710. It thus forms a conical shape at the support. When the wires are thermally oxidized 1740 such that they are just fully consumed, the conical shape at the support 1710 forms a very sharp silicon tip 1750. Oxide is stripped by a common method such as dipping the device in HF (Hydrofluoric acid). Tips can be broken off at the base (the base refers to the tip support or its broader portion).

Large arrays of such tips are self-aligned in pairs. Two tips formed by the same wire point at each other from their respective supports. Lateral tips are broken off to make probes for Atomic Force Microscopes. Arrays of field emitters may also be made using these tips. In one embodiment, the silicon is removed, forming a nanotip syringe from the oxide when broken off near the silicon tip.

In one embodiment, a three dimensional lattice of silicon tips formed from a semiconductor substrate has an array of parallel pillars orthogonal to the substrate. Each pillar has at least one nanotip on each pillar extending substantially perpendicular from the pillar to an adjacent pillar. The tips on adjacent pillars point toward each other, and each pillar may have multiple tips dispersed along it's height.

CONCLUSION

A method of forming structures in a semiconductor substrate is described. Columns are first defined in the substrate. The sides of the columns are then repetitively etching and passivated to create columns having ripples. Many different sized structures are created using the process. Nano-structures are formed using the process in combination with oxidation to further reduce structure size. Micron and sub-micron structures are useful in most of the application described above. For example, infra red wavelengths are of interest in photonic bandgap structures and for these wavelengths, micron scales are utilized. Nanofluidic channels may also be formed by oxidizing the scalloped trench in one embodiment. Hexogonal arrays may also be formed having varied optical properties. Many other structures may also be produced using this process.

What is claimed is:

1. A pair of columns formed from a semiconductor substrate, the columns comprising:
    multiple wires of silicon extending substantially parallel to a floor of the substrate between the pair of columns; and
    oxide surrounding each wire.

2. A three dimensional lattice of wires formed from a semiconductor substrate comprising:
    an array of substantially parallel pillars; and
    multiple micron to sub micron diameter silicon wires extending between the pillars.

3. The three dimensional lattice of wires of claim 2, wherein the pillars comprise pillars internal to the array, and pillars defining an outside edge of the array, wherein the internal pillars have multiple sets of wires extending perpendicular from each pillar toward another pillar.

4. The three dimensional lattice of wires of claim 2 wherein each wire is oxidized to create a sieve of desired wire spacing.

5. The three dimensional lattice of wires of claim 2 wherein the pillar and wire spacing is selected to form a photonic bandgap structure.

6. The three dimensional lattice of wires of claim 2 wherein the wires are periodic with respect to each other.

7. The three dimensional lattice of wires of claim 2 wherein the wires form hexagonal shapes.

8. The three dimensional lattice of wires of claim 3 wherein each set of wires comprises three substantially parallel silicon wires.

9. The three dimensional lattice of wires of claim 4 wherein pillar spacing is progressively smaller to create a graded sieve.

10. A displacement sensor comprising:
    a pair of opposing support structures;
    a wire extending between the support structures, wherein the wire is oxidized such that it is thicker at the support structures and fully oxidized between the support structures such that the wire forms opposed tips a desired distance apart.

11. A three dimensional lattice of wires formed from a semiconductor substrate comprising:
    an array of substantially parallel pillars;
    rows of multiple micron to sub micron diameter silicon wires extending between the pillars forming hexagonal shapes supported by the pillars; and
    a waveguide disposed between two of such rows.

12. The three dimensional lattice of wires of claim 11, wherein the pillars support multiple layers of wires forming layers of hexagonal shapes.

13. A three dimensional lattice of tips formed from a semiconductor substrate comprising:
  an array of substantially parallel pillars; and
  a nanotip on each pillar extending substantially perpendicular from the pillar to an adjacent pillar.

14. The three dimensional lattice of tips of claim 13 wherein tips on adjacent pillars point toward each other.

15. The three dimensional lattice of tips of claim 13 wherein each pillar has multiple tips dispersed along it's height.

16. The three dimensional lattice of tips of claim 13 wherein the tips comprise silicon.

* * * * *